(12) United States Patent
Jan

(10) Patent No.: US 8,866,246 B2
(45) Date of Patent: Oct. 21, 2014

(54) HOLDER ON CHIP MODULE STRUCTURE

(71) Applicant: LarView Technologies Corporation, Yangmei (TW)

(72) Inventor: Shin-Dar Jan, Hsinchu (TW)

(73) Assignee: LarView Technologies Corporation, Yangmei, Taoyuan County (TW)

( * ) Notice: Subject to any disclaimer, the term of this patent is extended or adjusted under 35 U.S.C. 154(b) by 0 days.

(21) Appl. No.: 13/666,364

(22) Filed: Nov. 1, 2012

(65) Prior Publication Data

US 2014/0117480 A1    May 1, 2014

(51) Int. Cl.
| | | |
|---|---|---|
| H01L 31/0232 | (2014.01) | |
| H01L 31/0203 | (2014.01) | |
| H01L 29/22 | (2006.01) | |
| H01L 29/227 | (2006.01) | |
| H01L 33/00 | (2010.01) | |

(52) U.S. Cl.
USPC ...... 257/432; 257/98; 257/434; 257/E33.056; 257/E33.057; 257/E33.058; 257/E33.073

(58) Field of Classification Search
USPC ............ 257/98, 432, 434, E33.056, E33.057, 257/E33.058, E33.073
See application file for complete search history.

(56) References Cited

U.S. PATENT DOCUMENTS

| | | | |
|---|---|---|---|
| 7,009,654 B2 * | 3/2006 | Kuno et al. ............. | 348/374 |
| 7,196,322 B1 * | 3/2007 | Hsin et al. .............. | 250/239 |
| 7,250,663 B2 * | 7/2007 | Campbell ............... | 257/433 |
| 7,423,334 B2 * | 9/2008 | Tu et al. ................ | 257/680 |
| 7,911,017 B1 * | 3/2011 | de Guzman et al. ...... | 257/432 |
| 8,049,815 B2 * | 11/2011 | Huang et al. ............. | 348/374 |
| 8,284,297 B2 * | 10/2012 | Chou .................... | 348/357 |
| 2003/0124773 A1 * | 7/2003 | Hashimoto ............. | 438/127 |
| 2005/0168846 A1 * | 8/2005 | Ye et al. ................ | 359/819 |
| 2006/0222300 A1 * | 10/2006 | Frenzel et al. .......... | 385/88 |
| 2007/0146894 A1 * | 6/2007 | Humpston ............... | 359/666 |
| 2008/0246845 A1 * | 10/2008 | Chan .................... | 348/207.2 |
| 2009/0096051 A1 * | 4/2009 | Sugiyama et al. ......... | 257/435 |
| 2009/0160998 A1 * | 6/2009 | Fukamachi et al. ....... | 348/340 |
| 2010/0060776 A1 * | 3/2010 | Topliss et al. ........... | 348/340 |
| 2011/0007203 A1 * | 1/2011 | Avron et al. ............ | 348/360 |
| 2011/0234893 A1 * | 9/2011 | Koseki ................. | 348/374 |
| 2011/0317287 A1 * | 12/2011 | Aoki et al. ............. | 359/813 |
| 2012/0043635 A1 * | 2/2012 | Yang ................... | 257/432 |
| 2012/0099201 A1 * | 4/2012 | Chan et al. ............. | 359/557 |
| 2012/0105713 A1 * | 5/2012 | Luan .................... | 348/374 |
| 2012/0169907 A1 * | 7/2012 | Lee ..................... | 348/294 |
| 2012/0243862 A1 * | 9/2012 | Kinoshita ............... | 396/439 |
| 2012/0257075 A1 * | 10/2012 | Kamada ................ | 348/222.1 |
| 2013/0314810 A1 * | 11/2013 | Sekimoto et al. ......... | 359/823 |

* cited by examiner

*Primary Examiner* — Ida M Soward

(74) *Attorney, Agent, or Firm* — Muncy, Geissler, Olds & Lowe, P.C.

(57) ABSTRACT

The present invention provides a holder on chip module structure including a substrate. A chip is configured on the substrate, with a sensing area. A holder is disposed on the substrate, wherein a portion of the holder is directly contacted to the chip to reduce the tilt between the chip and the holder. A transparent material is disposed on the holder, substantially aligning to the sensing area. A lens holder is disposed on the holder, and a lens is configured on the lens holder, substantially aligning to the transparent material and the sensing area.

16 Claims, 2 Drawing Sheets

HOLDER ON CHIP MODULE STRUCTURE

TECHNICAL FIELD

The present invention generally relates to a semiconductor device module structure, more particularly, to a holder on chip module structure by utilizing a holder directly contacting to the top surface of an image sensor to reduce the assembly tilt.

BACKGROUND

A traditional camera module includes an image sensor and one or more lens set. The lens set is disposed above the image sensor for the incident ray image mapping to the image sensor. Camera module with the image sensor can be applied to digital cameras, digital video recorders, mobile phones, smart phones, monitors and others electronic products with camera function.

For camera module, in order to ensure the image quality, it needs to strictly control the factors of affecting imaging quality to meet the requirement of higher and higher resolution of the lens module. During the module assembling, the tilt angle and the displacement of the image sensor chip at X/Y axis direction relative to the lens can affect the image quality, particularly the tilt angle affecting significantly. The current design of the camera module, the image sensor chip and the supporting holder are placed on a substrate. The tilt angle of lens relative to the image sensor may be affected by their materials, and the others affecting factors of the tilt angle come from two processes: adhering the image sensor chip to the substrate, and mounting the supporting holder on the substrate. And, the smoothness of the substrate will also affect the tilt angle caused by this process. This will affect the perpendicularity between the optical axis of the optical assembly and the sensing surface of the image sensor, and thereby affecting the quality of imaging.

Therefore, based-on the shortcomings of prior arts, the present invention provide a newly holder on chip module structure for enhancing imaging quality of camera module.

SUMMARY OF THE INVENTION

Based-on the shortcomings of the above-mentioned, an objective of the present invention is to provide a holder on chip module structure by integrating a supporting holder, an image sensor and a substrate to reduce the assembly tilt angle between the supporting holder and the chip.

According to an aspect of the present invention, the present invention provides a holder on chip module structure. The module structure comprises a substrate. A chip is configured on the substrate, with a sensing area. A holder disposed on the substrate, wherein a first portion of the holder is directly contacted to the chip to reduce a tilt angle between the chip and the holder, a second portion of the holder without contacting the chip. A transparent material is disposed on the holder, substantially aligning to the sensing area. A lens holder is disposed on the holder, and a lens is configured on the lens holder, substantially aligning to the transparent material and the sensing area.

The holder has a groove structure formed therein for allowing the chip disposed therein, and a through hole structure for exposing the sensing area of the chip. The holder has a ring groove structure located at a side of the through hole structure for the transparent plate disposed thereon. The chip is adhered to the substrate via a first adhesion layer, the holder adhered to the substrate via a second adhesion layer, and the lens holder adhered to the holder via a third adhesion layer. The substrate is a printed circuit board or a flexible printed circuit board. The lens holder is a plastic piece or an actuator, wherein the actuator includes a voice coil motor or a micro electro mechanical system.

The material of the first portion of the holder is not the same as that of the second portion of the holder. The holder is an integral structure.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The present invention provides a holder on chip module structure to reduce the assembly tilt by utilizing a holder directly contacting to the top surface of an image sensor. In other words, for the module structure, after assembled the holder with the image sensor and the substrate, it can reduce the tilt between the supporting holder and the image sensor, and thereby effectively enhancing the imaging quality of the image sensor.

Figure 1:
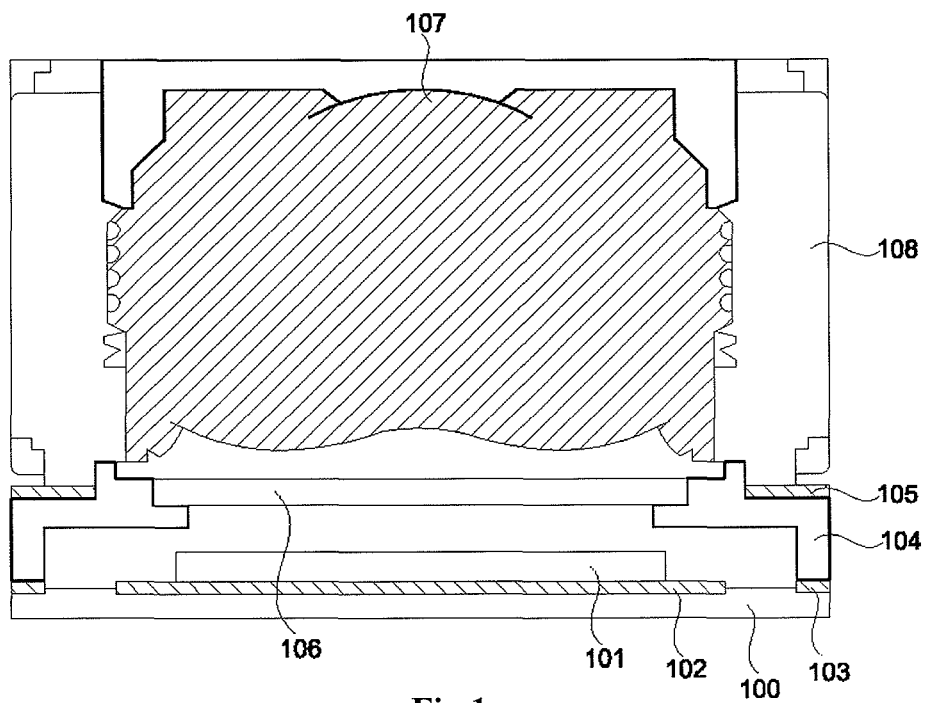
FIG. 1 illustrates a sectional view of a chip module structure by integrating a holder and an image sensor chip.

FIG. 1 shows a sectional view of a holder on chip module structure by integrating a lens holder and an image sensor chip. As shown in FIG. 1, the lens holder integrates the transparent plate and the image sensor chip to be as a module structure with sensing function, which can be applied to a camera module of a mobile phone. The holder on chip module structure comprises a substrate 100, a chip 101, a supporting holder 104, a transparent plate (material) 106, a lens 107 and a lens holder 108.

In the present invention, the lens holder 108 integrates the lens 107, the transparent plate 106, the supporting holder 104, the chip 101 and the substrate 100 to form a cubic module structure.

The lens holder 108 may be a plastic piece or an actuator adhered on the holder 104, and the holder 104 is adhered to the substrate 100 to complete the module structure of the present invention. For example, the actuator includes a voice coil motor (VCM) or a micro electro mechanical system (MEMS) structure. Currently, in the imaging apparatus, the voice coil motor is generally applied to drive lens of the camera module for focusing. In the structural design of the voice coil motor, the movable member may produce a displacement in the Z-axis direction by the driven coil's current, and generate a tilt angle in the X-axis direction and Y-axis direction, simultaneously.

The chip 101 may be adhered on (to) the substrate 100 via a conductive layer or a non-conductive adhesion layer 102.

The conductive layer may be as the adhesion layer 102 to form on the substrate 100. In one embodiment, material of the conductive layer includes a conductive paste or a conductive film, which may be formed as a pattern paste on the substrate by employing a printing or coating process. The conductive layer may be optically coated on the substrate 100. For example, the chip 101 is an image sensor chip which has a sensing area on the top surface and a contact pad formed thereon. The substrate 100 is a printed circuit board or a flexible printed circuit board. Size of the substrate 100 is larger than that of the chip 101 such that the chip 101 can be completely adhered on the substrate 100.

An adhesion layer 103 is formed on (side of) the substrate 100. The holder 104 is adhered on the substrate 100 via the adhesion layer 103, and the chip 101 is configured between the holder 104 and the substrate 100. The holder 104 has a groove structure formed therein for receiving or accumulating the chip 101, a through hole structure with an opening area for exposing the sensing (active) area and the contact pad. Moreover, the holder 104a has a ring groove structure located at a side of the through hole structure, which has a space for the transparent plate 106 disposed thereon. That is, the holder 104 can support the transparent plate 106. The transparent plate 106 is for example a glass substrate or the substrate made of a transparent material. The transparent plate 106 is located above the substrate 100 for covering the sensing area of the image sensor chip 101, and thereby creating a gap between the transparent plate 106 and the sensing area. The transparent plate 106 covers the sensing area of the image sensor chip 101 to reduce particles contamination for enhancing yield of the module structure. Size of the transparent plate 106 may be the same or larger than area of the sensing area.

The transparent plate (glass substrate) 106 may be round or square type. The transparent plate (glass substrate) 106 may be optionally coated infrared coating for filtering, such as infrared filter for filtering to a certain band of frequency by passing through the lens 107.

An adhesion layer 105 is formed on (side of) the holder 104. The bottom of the lens holder 104 is adhered on the supporting holder 104 via the adhesion layer 105. The lens 107 is fixed to the lens holder 108 for supporting the lens 107. Moreover, the lens holder 108 may be fixed to the supporting holder 104 for supporting the lens 107. In the module structure of this embodiment, the transparent plate 106 may be optionally disposed under the lens holder 108, and between the lens 107 and the chip 101. In other words, the lens 107 is substantially aligning to the transparent plate 106 and the chip 101.

In mounting process, the holder 104 is adhered to the substrate 100 via the adhesion layer 103, and the chip 101 is adhered to the substrate 100 via the adhesion layer 102. Based-on the above mounting process, a tilt angle will be created between the holder 104 and the chip 101, and the image sensor chip 101 itself may have an inclination. Besides, the structure of the substrate 100 itself has a warp angle. Thus, in the assembled module structure of the FIG. 1, a assembly tilt is created between the upper portion (lens 107/lens holder 108) and the lower portion (holder 104/sensor chip 101/substrate 100). The assembly tilt includes:

1). a tilt angle between the holder 104 and the chip 101;
2). a tilt angle of the image sensor chip 101 itself;
3). a warp angle of the substrate 100 itself.

Figure 2:
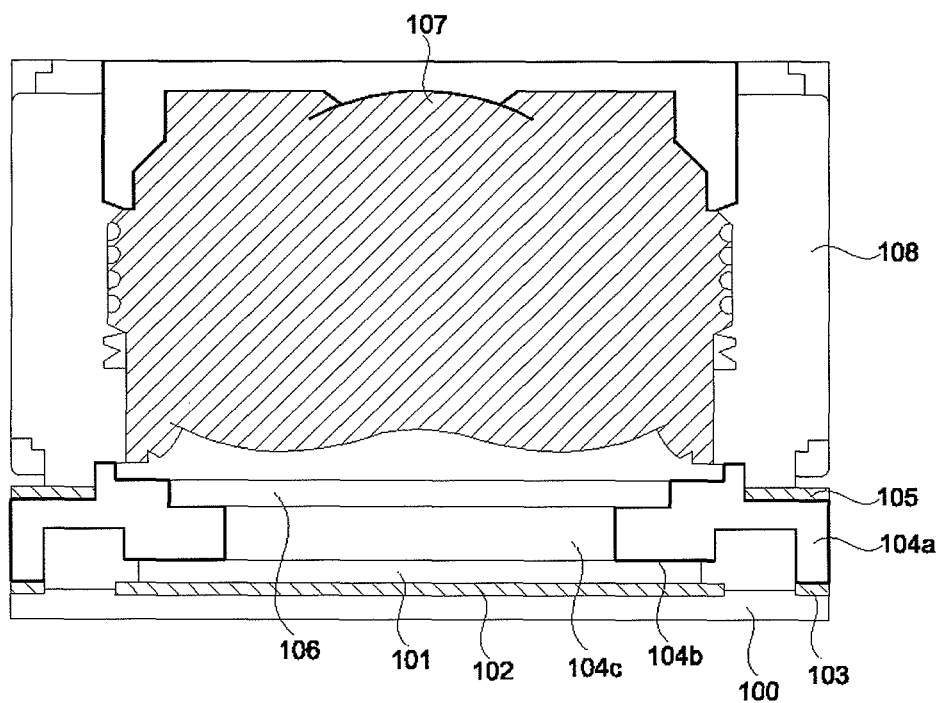
FIG. 2 illustrates a sectional view of a holder on chip module structure according to an embodiment of the present invention.

As shown in FIG. 2, it shows a sectional view of a holder on chip module structure according to an embodiment of the present invention. In this embodiment, the difference between the holder 104a structure and the holder 104 structure of the FIG. 1 is that between the holder 104 and the image sensor chip 101 has no contact, and a portion of the holder 104a structure is directly contacted to the image sensor chip 101. For example, the lower surface 104b of the portion of the holder 104a structure is directly contacted to the image sensor chip 101. In this embodiment, as the holder 104a is adhered to the substrate 100 via the adhesion layer 103, the holder 104a structure is directly contacted to the image sensor chip 101. Between the holder 104a and the image sensor chip 101 has no tile angle issue due to the holder 104a structure directly contacting to the image sensor chip 101. That is, a tilt angle of the image sensor chip 101 itself can be omitted. Moreover, the portion of the holder 104a structure is directly contacted on the image sensor chip 101, without contacting to the substrate 100, and therefore the warpage of the substrate 100 can be also omitted.

As above-mentioned, in the assembled module structure of the FIG. 2, the assembly tilt angle between the upper portion (lens 107/lens holder 108) and the lower portion (holder 104/sensor chip 101/substrate 100) can be reduced.

In one embodiment, the holder 104a structure is directly contacted to the periphery of the image sensor chip 101 to avoid for contacting or covering the sensing area of the image sensor chip 101. The portion of the support holder 104a contacted to the chip 101 is around the periphery of the image sensor chip 101, so that the gap (cavity) 104c between the transparent plate 106 and the sensing area becomes smaller.

In another example, the supporting holder 104a includes two portions, wherein the first portion contacts to the image sensor chip 101 and the second portion does not contact to the image sensor chip 101. Material of the first portion is identical or different from that of the second portion. The first portion is contacting and connecting to the second portion. The transparent plate and the lens holder are configured on the second portion of the holder 104a. For example, the material of the holder 104a contacting to the image sensor chip 101 may be utilized by a softer material to avoid damaging the surface of the image sensor chip 101. In other words, the supporting holder 104a may be constituted by a single material, or constituted by two (or above) kinds composite materials (i.e. material of the first portion is not the same as that of the second portion). The holder 104a may be an integral structure.

For example, the first portion of the holder 104a contacting to the image sensor chip 101 includes a coated layer or an adhesion layer. The coated layer is a material layer formed on the first portion of the holder 104a by utilizing a coating process, and the coated layer is contacted to the image sensor chip 101 by controlling its thickness. Similarly, the adhesion layer is adhered to first portion of the holder 104a, and the adhesion layer is contacted to the image sensor chip 101 by controlling its thickness.

In one embodiment of the present invention, the substrate 100 is a printed circuit board. Besides, the substrate 100 may be an organic substrate, and which material includes, for example epoxy type FR5 or FR4, or BT (Bismaleimide Triazine). Moreover, glass, ceramic and silicon may be as material of the substrate 100.

The foregoing descriptions are preferred embodiments of the present invention. As is understood by a person skilled in the art, the aforementioned preferred embodiments of the present invention are illustrative of the present invention rather than limiting the present invention. The present invention is intended to cover various modifications and similar arrangements included within the spirit and scope of the appended claims, the scope of which should be accorded the broadest interpretation so as to encompass all such modifications and similar structures.

What is claimed is:

1. A holder on chip module structure, comprising:
   a substrate;
   a chip configured on said substrate, with a sensing area;
   a supporting holder disposed on said substrate, wherein a first portion of said supporting holder is directly contacted to said chip to reduce a tilt angle between said chip and said supporting holder, a second portion of said supporting holder is contacted to said substrate and without contacting said chip, wherein said first portion of said supporting holder is made of a softer material to avoid damaging a surface of said chip; and
   a lens holder disposed on said supporting holder, and a lens configured on said lens holder, substantially aligning to said sensing area.

2. The module structure of claim 1, wherein said supporting holder has a groove structure formed therein for allowing said chip disposed therein, and a through hole structure for exposing said sensing area of said chip.

3. The module structure of claim 2, wherein said supporting holder has a ring groove structure located at a side of said through hole structure for a transparent plate disposed thereon.

4. The module structure of claim 1, wherein said chip is adhered to said substrate via a first adhesion layer, said supporting holder adhered to said substrate via a second adhesion layer, and said lens holder adhered to said supporting holder via a third adhesion layer.

5. The module structure of claim 1, wherein material of said first portion of said supporting holder is not the same as that of said second portion of said supporting holder.

6. The module structure of claim 1, wherein said supporting holder is an integral structure.

7. The module structure of claim 1, wherein said lens holder is a plastic piece or an actuator.

8. The module structure of claim 7, wherein said actuator includes a voice coil motor or a micro electro mechanical system.

9. The module structure of claim 1, further comprising a transparent material disposed on said supporting holder, substantially aligning to said sensing area.

10. The module structure of claim 9, wherein said supporting holder has a groove structure formed therein for allowing said chip disposed therein, and a through hole structure for exposing said sensing area of said chip.

11. The module structure of claim 10, wherein said supporting holder has a ring groove structure located at a side of said through hole structure for said transparent plate disposed thereon.

12. The module structure of claim 9, wherein said chip is adhered to said substrate via a first adhesion layer, said supporting holder adhered to said substrate via a second adhesion layer, and said lens holder adhered to said supporting holder via a third adhesion layer.

13. The module structure of claim 9, wherein material of said first portion of said supporting holder is not the same as that of said second portion of said supporting holder.

14. The module structure of claim 9, wherein said supporting holder is an integral structure.

15. The module structure of claim 9, wherein said lens holder is a plastic piece or an actuator.

16. The module structure of claim 15, wherein said actuator includes a voice coil motor or a micro electro mechanical system.

* * * * *